US012765298B2

(12) United States Patent
Ji et al.

(10) Patent No.: US 12,765,298 B2
(45) Date of Patent: Oct. 13, 2026

(54) METHOD FOR SINGULATING SEMICONDUCTOR SUBSTRATE BY ETCHING FRONT AND BACK SURFACES OF SEMICONDUCTOR SUBSTRATE

(71) Applicant: STATS ChipPAC Pte. Ltd., Singapore (SG)

(72) Inventors: IkSoo Ji, Incheon (KR); SooYeon Han, Incheon (KR)

( * ) Notice: Subject to any disclaimer, the term of this patent is extended or adjusted under 35 U.S.C. 154(b) by 303 days.

(21) Appl. No.: 18/469,523

(22) Filed: Sep. 18, 2023

(65) Prior Publication Data

US 2024/0096634 A1 Mar. 21, 2024

(30) Foreign Application Priority Data

Sep. 21, 2022 (CN) ......................... 202211152930.X

(51) Int. Cl.
*H10P 52/00* (2026.01)
*H10P 54/00* (2026.01)
*H10W 20/43* (2026.01)

(52) U.S. Cl.
CPC .............. *H10P 52/00* (2026.01); *H10P 54/00* (2026.01); *H10W 20/43* (2026.01)

(58) Field of Classification Search
CPC ......... H19P 52/00; H10P 54/00; H10W 20/43
See application file for complete search history.

(56) References Cited

U.S. PATENT DOCUMENTS 8,461,023 B1 6/2013 Swiler et al.
8,680,653 B2 3/2014 Miccoli et al.
2004/0070080 A1 4/2004 Pendse
2005/0263854 A1* 12/2005 Shelton .................. H10H 20/01 438/460
2007/0004175 A1 1/2007 Harris, Jr.
(Continued)

FOREIGN PATENT DOCUMENTS

EP 1394851 A2 3/2004
TW 202017123 A 5/2020

OTHER PUBLICATIONS

The Office Action for the counterpart Korean patent application 10-2023-0120262, mailed on Aug. 3, 2026.

*Primary Examiner* — Michael Jung
(74) *Attorney, Agent, or Firm* — Junhe Law Office P.C.; Yi Zhang

(57) ABSTRACT

A method for singulating a semiconductor substrate into individual semiconductor devices, comprising: providing a semiconductor substrate having a front surface and a back surface, wherein the semiconductor substrate comprises device regions that are separated from each other by respective predetermined saw streets; forming an interconnect layer on the front surface; etching the front surface at the predetermined saw streets to form respective frontside openings each having a first depth, wherein the first depth is smaller than a thickness of the semiconductor substrate; attaching a semiconductor element onto the front surface in each device region; and etching the back surface at the respective predetermined saw streets to form respective backside openings each having a second depth, wherein each frontside opening is at least partially aligned with the backside opening at the same saw street to singulate the device regions of the semiconductor substrate into individual semiconductor devices.

14 Claims, 16 Drawing Sheets

(56) References Cited

U.S. PATENT DOCUMENTS

| | | | | |
|---|---|---|---|---|
| 2015/0214077 | A1 | 7/2015 | Tsai et al. | |
| 2015/0334823 | A1* | 11/2015 | Hu | H10W 70/692 361/783 |
| 2016/0266332 | A1 | 9/2016 | Fasano et al. | |
| 2019/0333905 | A1 | 10/2019 | Raghunathan et al. | |
| 2020/0303329 | A1 | 9/2020 | Elsherbini et al. | |
| 2021/0225806 | A1* | 7/2021 | Shen | H10P 72/74 |
| 2021/0296194 | A1* | 9/2021 | Shah | H10W 74/014 |
| 2021/0335722 | A1 | 10/2021 | Chen et al. | |

* cited by examiner

METHOD FOR SINGULATING SEMICONDUCTOR SUBSTRATE BY ETCHING FRONT AND BACK SURFACES OF SEMICONDUCTOR SUBSTRATE

TECHNICAL FIELD

The present application generally relates to semiconductor packaging technology, and more particularly, to a semiconductor device and a method for making the same.

BACKGROUND OF THE INVENTION

The semiconductor industry is constantly faced with complex integration challenges as consumers want their electronic products to be lighter, smaller and have higher performance with more and more functionalities. One of the solutions is System-in-Package (SiP). SiP is a functional electronic system or sub-system that includes in a single package two or more heterogeneous semiconductor die, such as a logic chip, a memory, integrated passive devices (IPD), RF filters, sensors, heat sinks, or antennas.

Chip to wafer (C2 W) packages where smaller chips are attached onto a wafer of bigger chips which is then attached onto a substrate are widely used in photonic devices. The photonic device may have a waveguide region where the attached smaller chips and other components such as copper pillars are kept out. However, the need of such keep-out region increases the difficulty of manufacturing the photonic devices.

Therefore, there is a need to provide a semiconductor device with an improved layout.

SUMMARY OF THE INVENTION

An objective of the present application is to provide a semiconductor device with an improved layout to facilitate the manufacturing of the semiconductor device.

According to an aspect of the present application, a method for singulating a semiconductor substrate into individual semiconductor devices is provided. The method comprises: providing a semiconductor substrate having a front surface and a back surface, wherein the semiconductor substrate comprises device regions that are separated from each other by respective predetermined saw streets; forming an interconnect layer on the front surface of the semiconductor substrate; etching the front surface of the semiconductor substrate at the predetermined saw streets to form respective frontside openings each having a first depth, wherein the first depth is smaller than a thickness of the semiconductor substrate; attaching a semiconductor element onto the front surface of the semiconductor substrate in each device region; and etching the back surface of the semiconductor substrate at the respective predetermined saw streets to form respective backside openings each having a second depth, wherein each frontside opening is at least partially aligned with the backside opening at the same saw street to singulate the device regions of the semiconductor substrate into individual semiconductor devices.

According to another aspect of the present application, a method for making a semiconductor device is provided. The method comprises: providing a semiconductor substrate having a front surface and a back surface, wherein the semiconductor substrate comprises device regions that are separated from each other by respective predetermined saw streets; forming an interconnect layer on the front surface of the semiconductor substrate; etching the front surface of the semiconductor substrate at the predetermined saw streets to form respective frontside openings each having a first depth and a first width, wherein the first depth is smaller than a thickness of the semiconductor substrate, and the first width is smaller than a width of the corresponding predetermined saw street; attaching a semiconductor element onto the front surface of the semiconductor substrate in each device region; etching the back surface of the semiconductor substrate at the respective predetermined saw streets to form respective backside openings each having a second depth and a second width, wherein each frontside opening is partially aligned with the backside opening with an offset at the same saw street to singulate the device regions of the semiconductor substrate into individual semiconductor devices and form a step at an edge of the corresponding semiconductor device at the saw street; attaching the individual semiconductor device to an external substrate through the first set of the conductive pillars; and attaching onto the step of each semiconductor device an auxiliary structure.

According to yet another aspect of the present application, a semiconductor device is provided. The semiconductor device comprises: a first substrate having a front surface and a back surface that is opposite to the first surface, wherein the first substrate further comprises: an active layer on the front surface; a waveguide formed in the active layer and adjacent to a lateral surface of the active layer; an interconnect layer on the active layer; a semiconductor element attached on the interconnect layer; and a first set of conductive pillars on the interconnect layer, wherein the first set of conductive pillars has a height greater than a height of the semiconductor element; a second substrate connected with the front surface of the first substrate through the first set of conductive pillars; and an auxiliary structure attached onto an edge of the first substrate, wherein the auxiliary structure comprises an external waveguide that is aligned with the waveguide in the active layer.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like part.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "front", "back", "left", "right", "vertical", "horizontal", "side" and the like, may be used herein for ease of description to describe one element or feature's relationship to another element(s) or feature(s) as shown in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
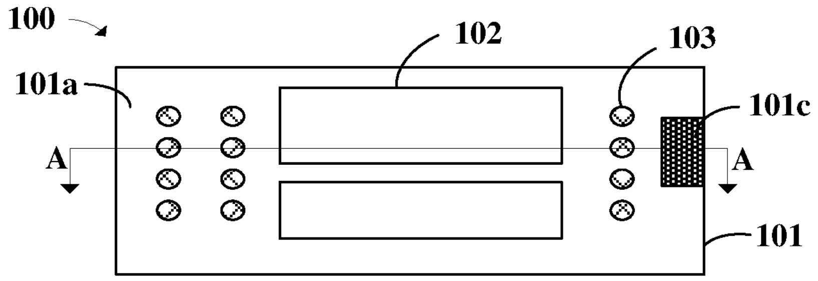
FIGS. 1A to 1B are schematic diagrams of a semiconductor device.
Figure 1B:
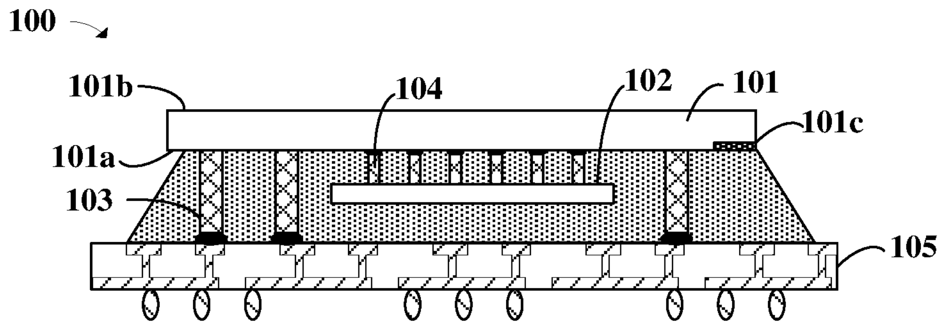

FIGS. 1A to 1B are schematic diagrams showing a semiconductor device 100. FIG. 1A shows a top surface of the semiconductor device 100, and FIG. 1B shows a sectional view of the semiconductor device 100 along a section line A-A in FIG. 1A.

As shown in FIGS. 1A and 1B, the semiconductor device 100 includes a first semiconductor element 101 and a second semiconductor element 102 that are connected with each other. Both of the first and second semiconductor elements 101 and 102 may be semiconductor dies. The first semiconductor element 101 is bigger than the second semiconductor element 102 in size, such that the semiconductor element 102 can be attached onto the front surface 101*a* of the first semiconductor element 101 via a set of conductive pillars 104. Furthermore, the first semiconductor element 101 is attached onto a substrate 105 via another set of conductive pillars 103 that are besides the second semiconductor element 102. A waveguide is formed at a front surface 101*a* of the first semiconductor element 101 so that the semiconductor element 102 should be kept out from the waveguide region 101*c* where the waveguide is formed. As such, the waveguide region 101*c* is a keep out zone for the second semiconductor element 102 and the conductive pillars 103 and 104, thereby the front surface 101*a* of the first semiconductor element 101 cannot be fully utilized for circuitry of the first semiconductor element 101.

Figure 2:
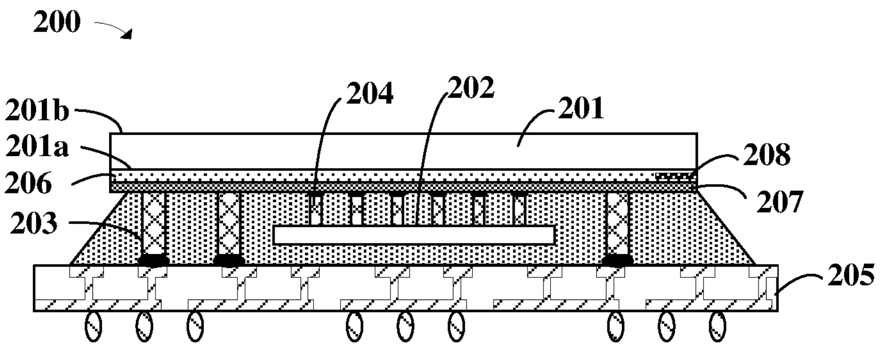
FIG. 2 is a sectional view of a semiconductor device according to one embodiment of the present application.

FIG. 2 is a sectional view of a semiconductor device 200 according to one embodiment of the present application.

Referring to FIG. 2, the semiconductor device 200 includes a first semiconductor element 201, such as a semiconductor die, and a substrate 205 where the first semiconductor element 201 is mounted. The substrate 205 can be a laminate interposer, PCB, wafer-form, strip interposer, leadframe, or another suitable substrate. The substrate 205 may include one or more insulating or passivation layers, one or more conductive vias formed through the insulating layers, and one or more conductive layers formed over or between the insulating layers. The substrate 205 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The substrate 205 can also be a multi-layer flexible laminate, ceramic, copper clad laminate, glass, or semiconductor wafer including an active surface containing one or more transistors, diodes, and other circuit elements to implement analog circuits or digital circuits. The substrate 205 may include one or more electrically conductive layers or redistribution layers (RDL) formed using sputtering, electrolytic plating, electroless plating, or other suitable deposition process. The substrate conductive patterns may be one or more layers of Al, Cu, Sn, Ni, Au, Ag, titanium (Ti), tungsten (W), or other suitable electrically conductive material.

As shown in FIG. 2, the first semiconductor element 201 includes a front surface 201*a* and a back surface 201*b* opposite to the front surface 201*a*. In the embodiment shown in FIG. 2, the front surface 201*a* is facing towards the substrate 205, while the back surface 201*b* is facing away from the substrate 205. An active layer 206 is formed on the front surface 201*a*, with such as a waveguide 208 formed within the active layer 206 and adjacent to a lateral surface of the active layer 206. The waveguide 208 can be exposed from the lateral surface of the active layer 206 to optically communicate with a photonic device (not shown) external to the semiconductor device 200. In some embodiments, the active layer 206 may include a dielectric layer such as a silicon oxide layer, a silicon nitride layer, a polymer layer or a silicon-on-insulator layer where the waveguide and some other photonic components may be formed. For example, the waveguide 208 may be formed by patterning a portion of the active layer 206. It can be appreciated that the active layer 206 may include a semiconductor layer where one or more active circuits may be formed. For example, the active circuits may include one or more optical detector array, one or more signal modulators, one or more amplifiers, one or more input/output circuits, one or more power supplies, etc. Furthermore, an interconnect layer 207 may be formed on the active layer 206. The interconnect layer 207 may be a redistribution layer (RDL), for example. The particulars of the interconnect layer 207 will be elaborated below. It can be appreciated that conductive vias may be formed through the active layer 206 to ensure desired electrical connection between the first semiconductor element 201 with the interconnect layer 207. It can be appreciated that conductive vias can be formed in the active layer 206 by drilling after the interconnect layer 207 is formed.

The first semiconductor element 201 is attached to the substrate 205 via a first set of conductive pillars 203. That is, first ends of the first set of conductive pillars 203 are connected with the interconnect layer 207 of the first semiconductor element 201, and second ends of the first set of conductive pillars 203 are connected with a top surface of the substrate 205. A second semiconductor element 202 is attached on the interconnect layer 207 via a second set of conductive pillars 204, backside of the first semiconductor element 201 and in between the first semiconductor element 201 and the substrate 205. It can be appreciated that the interconnect layer 207 may have conductive patterns facing towards the substrate 205, and a plurality of conductive vias and/or conductive interlayers within the interconnect layer 207. The interconnect layer 207 can therefore electrically connect the internal circuitry of the first semiconductor element 201 with the second semiconductor element 202 via the second set of conductive pillars 204, and with the substrate 205 via the first set of conductive pillars 203. Moreover, an insulating material such as an underfill material can be filled between the first semiconductor element 201 and the substrate 205 to protect and support the conductive pillars 203 and 204 and the second semiconductor element 202.

In the embodiment, the first set of conductive pillars 203 have a height greater than a sum of a height of the second semiconductor element 202 and the second set of conductive pillars 204, such that the second semiconductor element 202 may not be in contact with the top surface of the substrate 205 and thus may not interfere with the attachment of the first semiconductor element 201 to the substrate 205. Although the semiconductor device 200 is shown in FIG. 2 having only one second semiconductor element 202 between the first semiconductor element 201 and the substrate 205, those skilled in the art can understand that the semiconductor device may include one or more second semiconductor elements. In some embodiments, the first semiconductor element 201 and the second semiconductor element 202 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. In some embodiments, a bulk layer between the front surface 201*a* and the back surface 201*b* of the first semiconductor element 201 can be silicon or other suitable semiconductor materials. In some embodiments, the first and second sets of conductive pillars 203, 204 can be copper pillars or other conductive pillars. An auxiliary structure (not shown), such as a photonic device, may be attached onto the first semiconductor element 201 such that an external waveguide in the auxiliary structure can be aligned with the waveguide 208 formed in the active layer 206.

Figure 3:
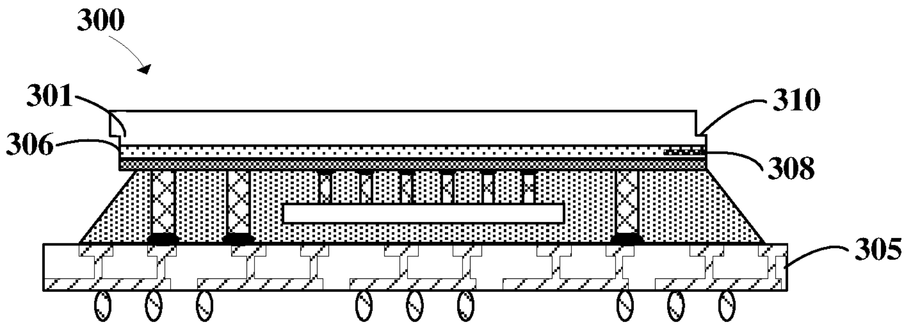
FIG. 3 is a sectional view of a semiconductor device according to another embodiment of the present application.

FIG. 3 is a sectional view of a semiconductor device 300 according to another embodiment of the present application.

As shown in FIG. 3, different from the semiconductor device 200 shown in FIG. 2, the semiconductor device 300 has a step 310 at an edge of the first semiconductor element 301, which may not interfere with the circuitry formed in the first semiconductor element 301. For example, the step 310 may be formed adjacent to a front surface of the first semiconductor element 301, away from the back surface of the first semiconductor element 301 where the circuitry is formed. In the embodiment shown in FIG. 3, the step can be close to a waveguide 308 formed in an active layer 306 of the first semiconductor element 301. As such, the step 310 provides an anchor region for an auxiliary structure (not shown) such as an external photonic device to be attached to the semiconductor device 300, such that the auxiliary structure can be more firmly secured onto the semiconductor device 300. It can be appreciated that one or more additional steps may be formed in the first semiconductor element 301 close to its lateral surfaces. Furthermore, one or more steps may be used for the attachment of a single external device to the semiconductor device 300.

Figure 4:
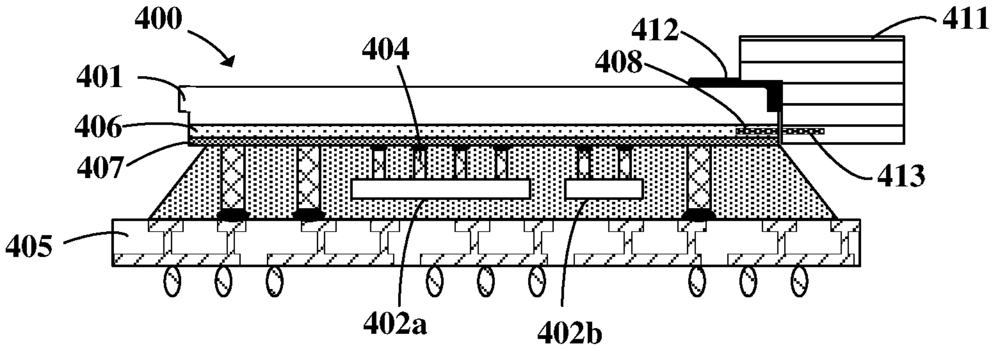
FIG. 4 is a sectional view of a semiconductor device with an auxiliary structure according to yet another embodiment of the present application.

FIG. 4 is a sectional view of a semiconductor device 400 with an auxiliary structure according to yet another embodiment of the present application.

As shown in FIG. 4, a first semiconductor element 401 is attached to a substrate 405 via a set of conductive pillars. In addition, a second semiconductor element 402*a* and a third semiconductor element 402*b* are attached onto an interconnect layer 407 of the first semiconductor element 401 via a second set of conductive pillars 404. The auxiliary structure 411 is attached onto a step formed on the first semiconductor element 401 through adhesive 412, such as ultraviolet epoxy, and an external waveguide 413 in the auxiliary structure 411 can be aligned with an internal waveguide 408 inside the first semiconductor element 401, or specifically inside an active layer 406 of the first semiconductor element 401.

Figure 5:
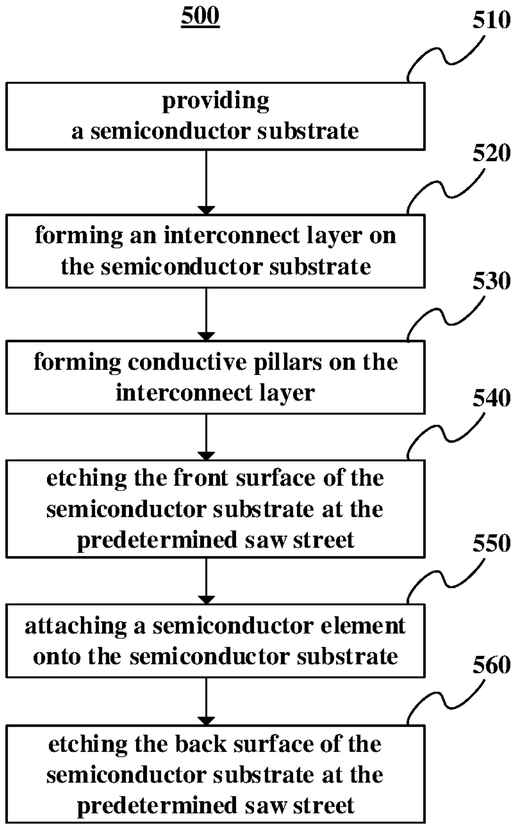
FIG. 5 is a flowchart of a method for making a semiconductor device according to one embodiment of the present application.

In order to manufacture one or more of the above semiconductor devices or similar devices, various methods are proposed according to some embodiments of the present application. The methods can be implemented as chip to wafer level processes, that is, various smaller semiconductor elements in form of chips or dice can be attached onto a semiconductor wafer, which later can be singulated into pieces each mounted with one or more desired semiconductor elements. FIG. 5 is a flowchart of a method 500 for making a semiconductor device according to one embodiment of the present application. For example, the method may be used to make the semiconductor device 200 shown in FIG. 2.

As shown in FIG. 5, the method 500 may start with providing a semiconductor substrate in block 510. In block 520, an interconnect layer is formed on the semiconductor substrate. Afterwards, a plurality of conductive pillars are formed on the interconnect layer in block 530. In block 540, a front surface of the semiconductor substrate is etched at one or more predetermined saw streets of the semiconductor substrate, without cutting through the semiconductor substrate. Next, in block 550, semiconductor elements can be attached onto the semiconductor substrate. Finally, a back surface of the semiconductor substrate can be etched at the predetermined saw streets in block 560, thereby the semiconductor substrate can be singulated at the predetermined saw streets as several individual semiconductor devices.

FIGS. 6A to 6I are sectional views of various steps of a method for making a semiconductor device according to one embodiment of the present application. In the following, the method 500 of FIG. 5 will be described with references to FIGS. 6A to 6I in more details.

Figure 6A:
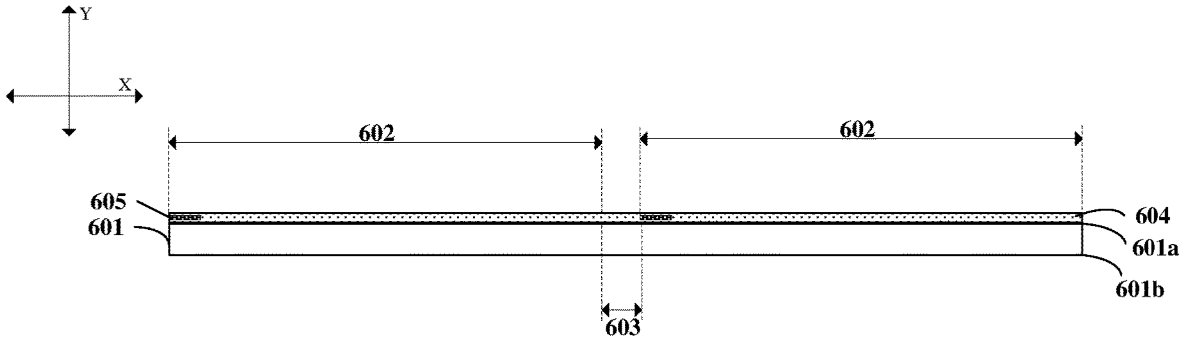
FIGS. 6A to 6I are sectional views of various steps of a method for making a semiconductor device according to one embodiment of the present application.

As shown in FIG. 6A, a semiconductor substrate 601 is provided. The semiconductor substrate 601 has a front surface 601*a*, a back surface 601*b*, and a bulk layer between the front surface 601*a* and the back surface 601*b*. When viewed from top of the semiconductor substrate 601, the semiconductor substrate 601 may have one or more device regions 602, and one or more saw streets 603. It should be noted that there is only one saw street shown in FIG. 6A for illustration purpose, which divides the semiconductor substrate 601 into two device regions. However, there may be more saw streets, e.g., two, three or more saw streets when more devices regions 602 (which are later singulated into respective semiconductor devices) are desired. The saw streets 603 may generally be of a strip shape or other suitable shapes, such that the semiconductor substrate 601 can be etched at the saw streets 603 using a blade or other singulating means such as plasma etching or reactive ion etching. In some embodiments, each strip-shaped saw street may have a width ranging from 80 um to 100 um in a horizontal direction X as shown in FIG. 6A, such as 80 um, 90 um, or 100 um.

The semiconductor substrate 601 further has an active layer 604 formed on the bulk layer and a waveguide 605 formed inside the active layer 604. It should be appreciated that the number of waveguides may be corresponding to the number of semiconductor devices to be formed from the substrate 601 such that each semiconductor device may have a waveguide 605. Each waveguide 605 may be positioned at an edge of a saw street, or at an edge of the semiconductor substrate 601 so that it can be exposed when the semiconductor substrate at the saw street is removed. The bulk layer of the semiconductor substrate 601 may have a thickness ranging from 600 um to 1000 um in a vertical direction Y as shown in FIG. 6A, e.g., 600 um, 700 um, 750 um, 800 um, 850 um, 900 um, or 1000 um. The active layer 604 on top of the bulk layer may have a thickness ranging from 6 um to 12 um, e.g., 6 um, 7 um, 8 um, 9 um, 10 um, 11 um, or 12 um.

Figure 6B:
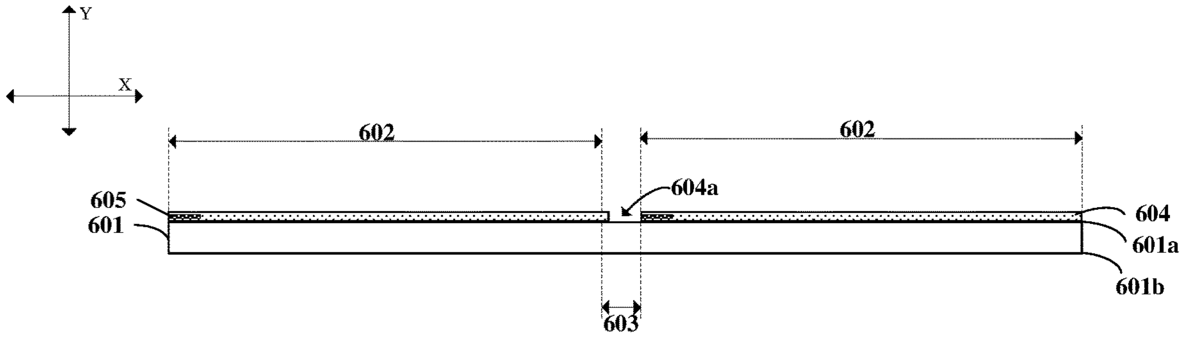

Next, referring to FIG. 6B, the active layer 604 is etched at the saw street 603 to form an active window 604*a* for exposing the front surface 601*a* of the semiconductor substrate 601, particularly the bulk layer. Each waveguide 605 within the active layer 604 is adjacent to a corresponding active window 604*a* or at the edge of saw street 603, thereby the waveguide 605 can be exposed laterally from the active layer 604 through the active window 604*a*. The active window 604*a* may have a width equal to or smaller than that of the saw street 603. In an example, the saw street 603 has a width of 100 um, and the active window 604*a* has a width of 80 um that is smaller than the width of the saw street 603. In some embodiments, the patterned active layer 604 (and some other layers such as the interconnect layer 606 shown in FIG. 6C or an additional patterned photoresist layer) may serve as a mask for the subsequent etching of the bulk layer using deep reactive ion etching process, for example.

Figure 6C:
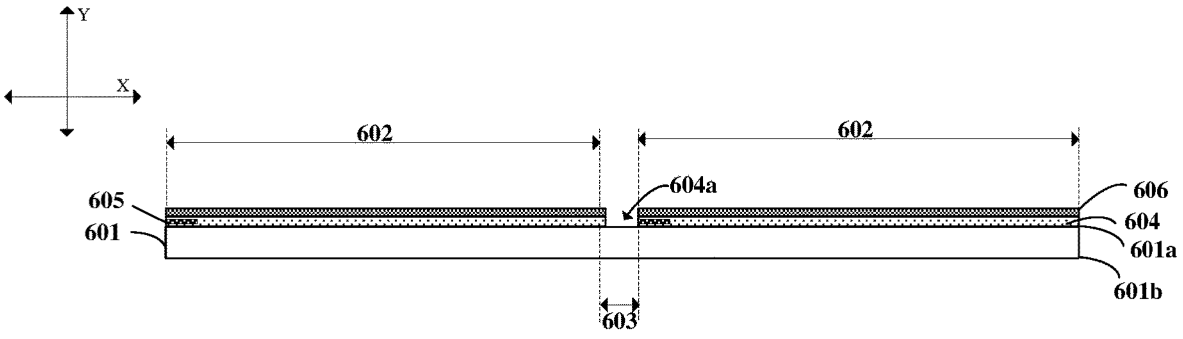
Figure 6D:
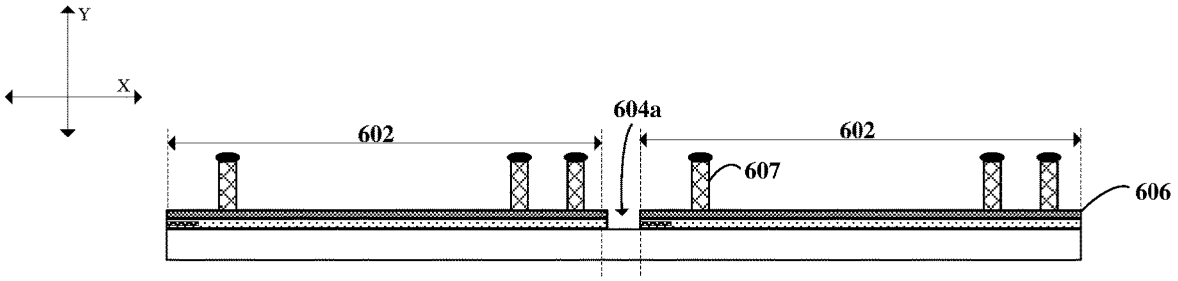

Next, as shown in FIG. 6C, an interconnect layer 606 such as a redistribution layer may be formed on the front surface 601*a* of the semiconductor substrate 601. It should be noted that the interconnect layer 606 may be formed particularly above the active layer 604. For example, the interconnect layer 606 may be deposited on the semiconductor substrate 601 and then a portion (not shown) of the interconnect layer 606 inside the active window 604*a* may be removed. In some embodiments, the interconnect layer 606 may be deposited on the semiconductor substrate 601 before forming the active window 604*a*, and then the laminated interconnected layer 606 and active layer 604 can be etched together to form the active window 604*a* which exposes the underneath bulk layer of the semiconductor substrate 601. Furthermore, a first set of conductive pillars 607 are formed in each device region 602 that are electrically connected to the interconnect layer 606, as shown in FIG. 6D.

Figure 6E:
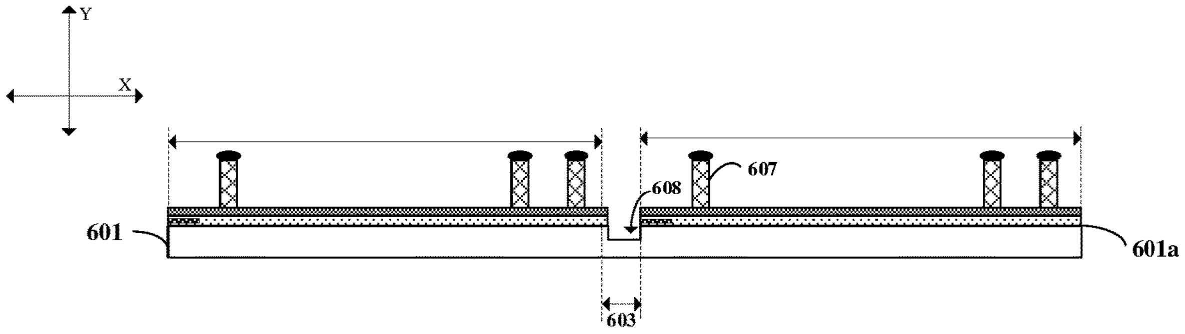
Figure 6F:
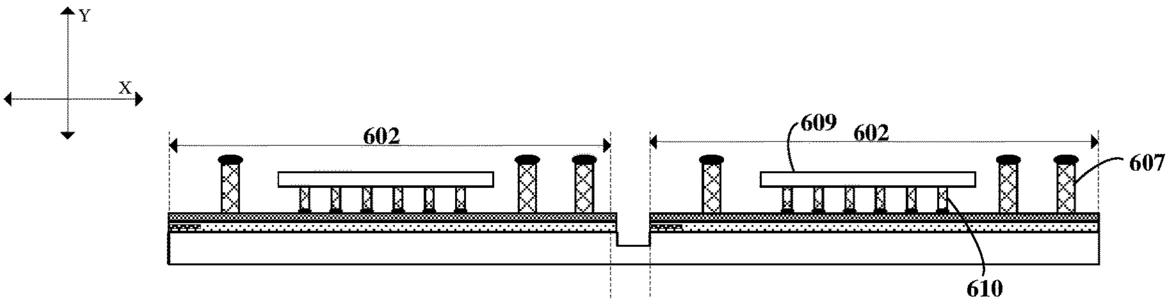

Referring to FIG. 6E, a front surface 601*a* of the semiconductor substrate 601 is etched at the saw street 603 to form a frontside opening 608. The frontside opening 608 has a depth smaller that the height of bulk layer of the semiconductor substrate 601 in the vertical direction Y. For example, the front surface 601*a* may be etched at the active window using deep reactive ion etching process. Afterwards, one or more second semiconductor elements 609 and a second set of conductive pillars 610 are attached onto each device region 602 of the semiconductor substrate 601 in FIG. 6F. The first set of conductive pillars 607 have a height greater than a height of the semiconductor element and/or the second set of conductive pillars 610. That is, the topmost surface of the second semiconductor element as shown in FIG. 6F may not be higher than the top ends of the first set of conductive pillars 607.

Figure 6G:
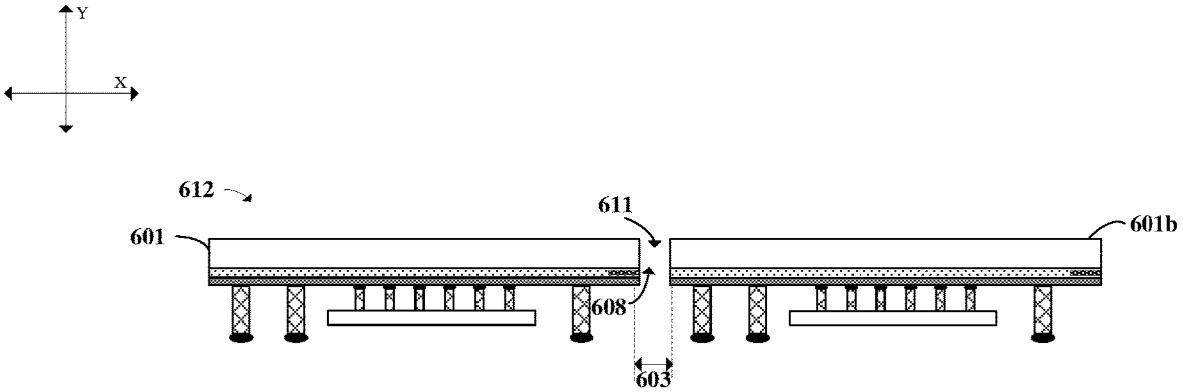

Next, as shown in FIG. 6G, the semiconductor substrate 601 is flipped with its back surface 601*b* oriented upward. Then, the back surface 601*b* of the semiconductor substrate 601 is etched at the saw street 603 to form a backside opening 611 aligned with the frontside opening 608. A sum of the depth of the frontside opening 608 and the depth of the backside opening 611 is equal to or greater than (when there is some offset between the openings) the height of the semiconductor substrate 601 in the vertical direction, such that the device regions 602 of the semiconductor substrate 601 can be singulated into individual semiconductor elements 612. In some embodiments, the back surface 601*b* can be etched using deep reactive ion etching process.

Figure 6H:
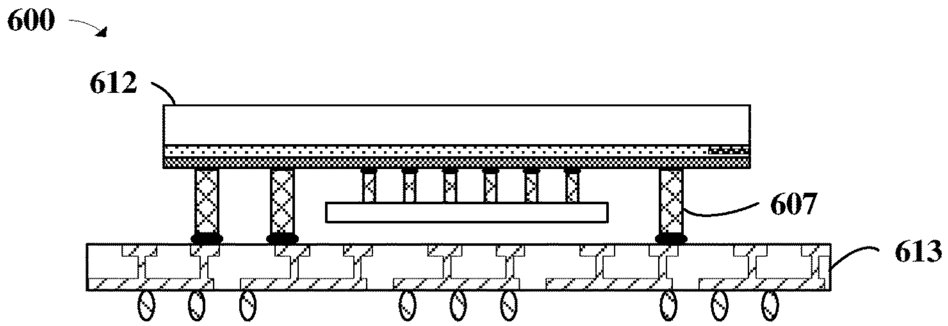
Figure 6I:
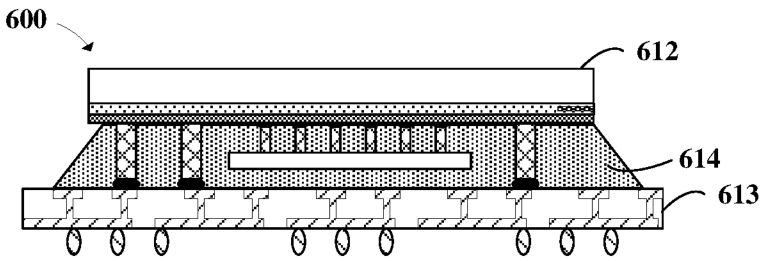

Afterwards, each individual semiconductor element 612 is attached to a substrate 613 through the first set of conductive pillars 607, as shown in FIG. 6H. As shown in FIG. 6I, an underfill material 614 may be filled into a space between the semiconductor element 612 and the substrate 613 to encapsulate the semiconductor elements and conductive pillars. The underfill material 614 may be made of a polymer composite material such as epoxy resin with filler, epoxy acrylate with filler, or polymer with proper filler, for example. In this way, a semiconductor device 600 is formed, which includes the substrate 613, and at least two semiconductor elements mounted on the substrate 613 directly or indirectly.

Furthermore, in order to manufacture the semiconductor device 400 with the step structure, another method is proposed according to an embodiment of the present application. Similarly, the method can be implemented as a chip to wafer level process, that is, various smaller semiconductor elements in form of chips or dice can be attached onto a semiconductor wafer, which later can be singulated into pieces each mounted with one or more desired semiconductor elements.

Figure 7A:
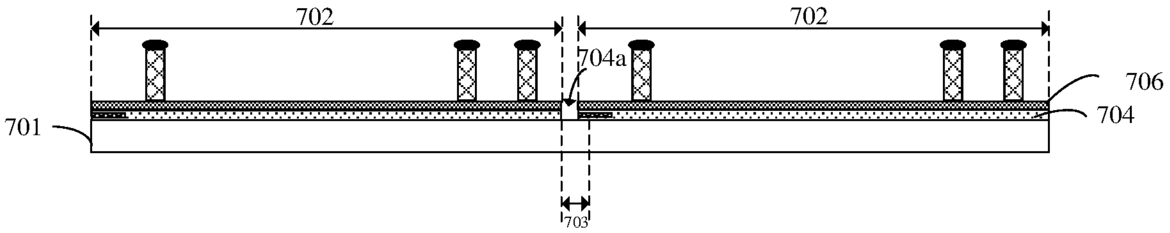
FIGS. 7A to 7G are sectional views of various steps of a method for making a semiconductor device according to another embodiment of the present application
Figure 7B:
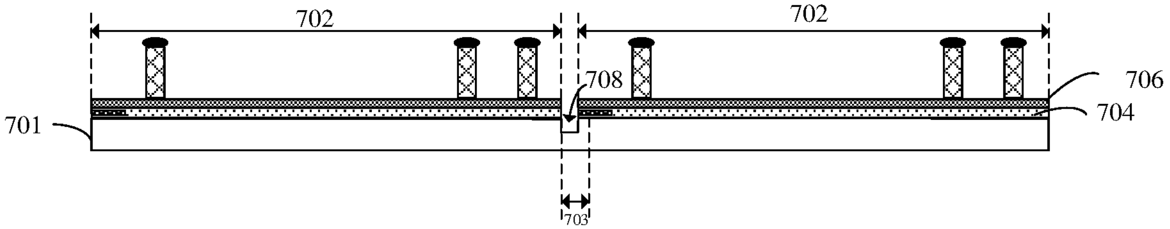
Figure 7C:
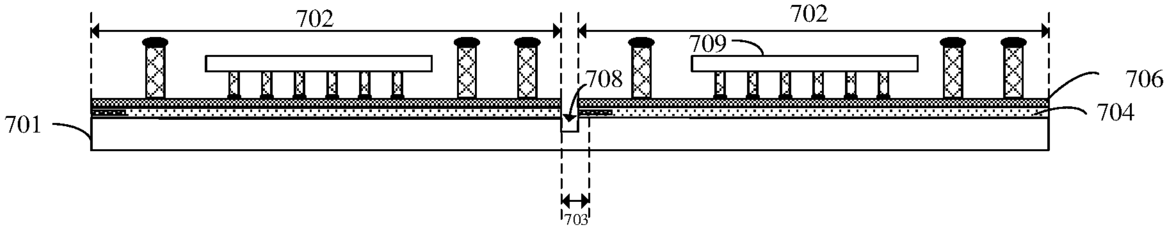
Figure 7D:
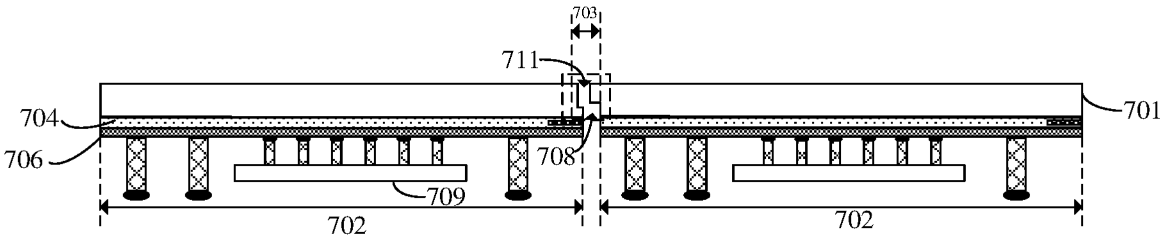
Figure 7E:
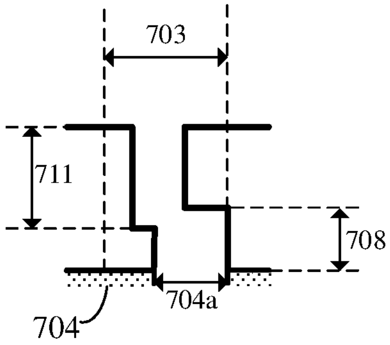
Figure 7F:
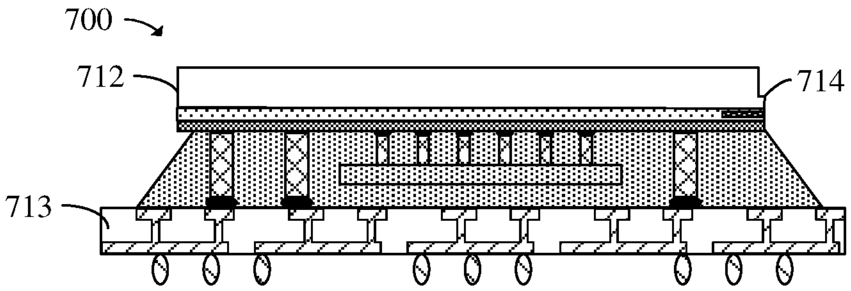
Figure 7G:
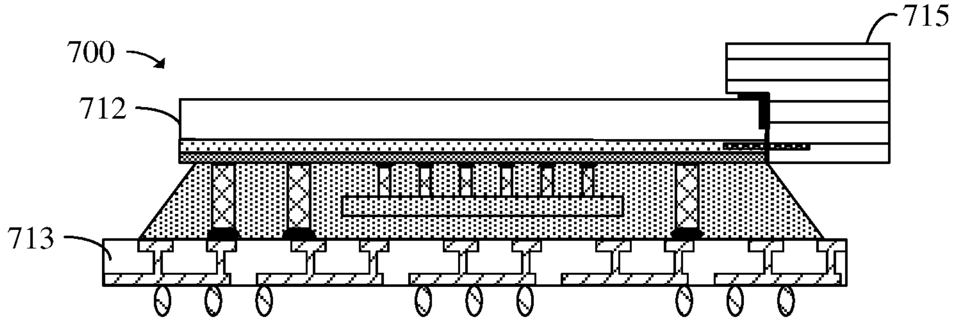

FIGS. 7A to 7G are sectional views of various steps of a method for making a semiconductor device 700 according to another embodiment of the present application. FIGS. 7A to 7D and 7F illustrate a semiconductor substrate 701 that is a variant of the semiconductor substrate 601 shown in FIGS. 6C to 6F in some steps of the method. FIG. 7E is a partially enlarged view of a step at an edge of the semiconductor substrate 701 shown in FIG. 7D, FIG. 7G is a sectional view of the semiconductor device with an auxiliary structure mounted thereon.

As illustrated in FIGS. 7A and 7B, compared with the semiconductor substrate 601 shown in FIG. 6E, the waveguide region of the active layer 706 is partially formed within the saw street 703. The semiconductor substrate 701 is formed with one or more frontside openings 708 inside respective active windows 704*a* on its front surface, and the active window 704*a* is adjacent to the waveguide in the active layer 706 for laterally exposing the waveguide. The active windows 704*a* pass through an active layer 704 and an interconnect layer 706 on the substrate 701. Each frontside opening 708 may have a width that is 20% to 90% of the width of a saw street 703 where it is formed. For example, the frontside opening 708 may have a width that is 20%, 30%, 40%, 50%, 60%, 70%, 80% or 90% of the width of the saw street 703, which divides the substrate 701 into various device regions 702. In the embodiment shown in FIG. 7B, the frontside opening 708 has a width of 40 um that is 40% of the saw street 703, and the frontside opening 708 may reach an edge of the saw street 703 that is facing away from the waveguide region. In some other embodiments, the frontside opening 708 may not reach an edge of the saw street 703.

Next, second semiconductor elements 709 are mounted the semiconductor substrate 701 in the respective device regions 702 in FIG. 7C, and frontside openings 708 are formed at the saw streets 703 by etching. The semiconductor substrate 701 is then flipped with its back surface oriented upward in FIG. 7D. Then, the back surface of the semiconductor substrate 701 is further etched at the saw street 703 to form a backside opening 711. Referring to FIG. 7E, the backside opening 711 has a width smaller than the width of the saw street 703, and the backside opening 711 has an offset relative to the frontside opening 708 at the same saw street 703. Further, the depth of the backside opening 711 is smaller than the thickness of the device region 702, but a sum of the depth of the backside opening 711 and the depth of the frontside opening 708 is greater than the thickness of the device region 702. In this way, the semiconductor substrate 701 can be singulated into individual semiconductor elements 712 and a step 714 can be formed at an edge of the corresponding semiconductor device 700 shown in FIG. 7F. In some embodiments, the backside opening 711 may have a width that is substantially equal to a width of the saw street. In some embodiments, the step 714 may have a thickness of 10 um, 20 um, 30 um, 40 um, for example, which is smaller than the depth of the frontside opening 708.

It should be noted that the active window, the frontside opening and the backside opening may be sawed by mechanical sawing, laser ablation, plasma etching, reactive ion etching, etc. In particular, the plasma or reactive ion etching process is preferred because such process is clean and may not incur damage to semiconductor substrates.

Next to FIG. 7F, the semiconductor element 712 can be attached onto a substrate 713 to form a semiconductor device 700, and a space between the semiconductor element 712 and the substrate 713 can be filled with an underfill material for packaging and protection purpose. Afterwards, an auxiliary structure 715 can be attached onto the semiconductor device 700, particularly at the step 714 of the semiconductor device 700 in FIG. 7G. For example, the auxiliary structure 715 can be attached to the semiconductor device 700 at the step using adhesive. As such, the step 714 provides an anchor region for the auxiliary structure such as an external photonic device. Furthermore, a photonic region such as a waveguide region in the auxiliary structure 715 can be aligned with an internal waveguide region of the semiconductor device 700. It can be appreciated that there may be no gap between the waveguide region in the auxiliary structure 715 and the internal waveguide region of the semiconductor device 700 for optical communication therebetween, after they are connected together.

Figure 8A:
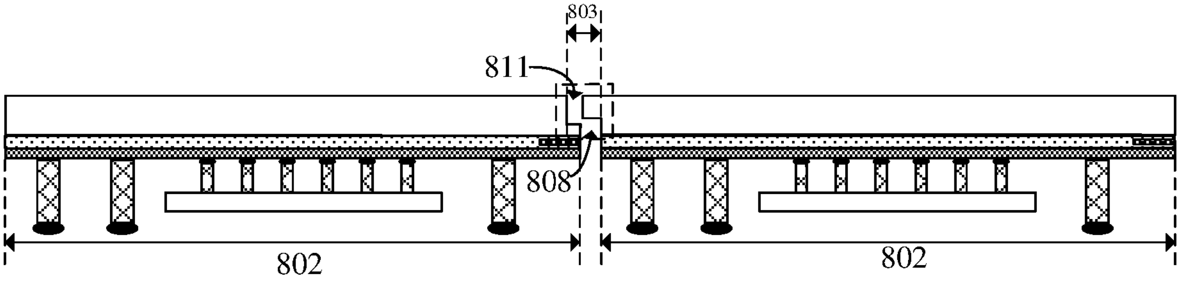
FIGS. 8A and 8B are sectional views of another exemplary semiconductor device made using the method shown in FIGS. 7A to 7G.
Figure 8B:
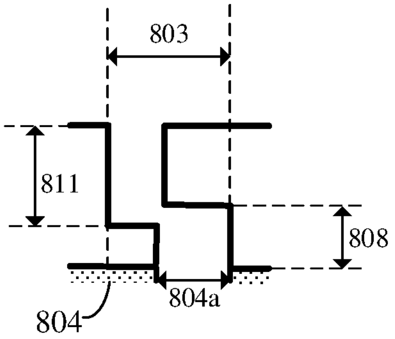

FIGS. 8A and 8B are sectional views of another exemplary semiconductor device made using the method shown in FIGS. 7A to 7G. FIG. 8B is a partially enlarged view of a step at an edge of the semiconductor element shown in FIG. 8A.

As shown in FIG. 8A, two device regions 802 are singulated by etching the frontside opening 808 and the backside opening 811 at the saw street 803. Particularly, as shown in FIG. 8B, the backside opening 811 is adjacent to an edge of the saw street 803, and the frontside opening 808 is relatively away from the edge. The openings 811 and 808 may have only very small overlap. Since a sum of a depth of the backside opening 811 and a depth of the frontside opening 808 is greater than the thickness of the device region 802, the semiconductor substrate can be singulated into individual semiconductor elements. Moreover, since the depth of the backside opening 811 is smaller than the thickness of the device region 802, a step is formed at an edge of each semiconductor element.

Figure 9A:
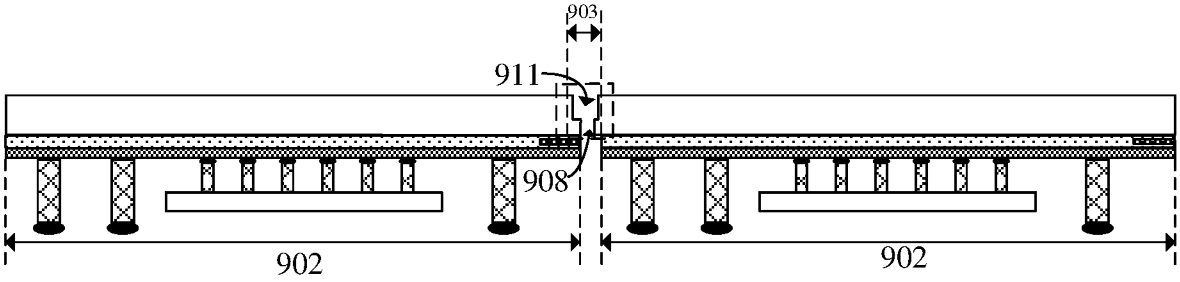
FIGS. 9A and 9B are sectional views of yet another exemplary semiconductor device made using the method shown in FIGS. 7A to 7G.
Figure 9B:
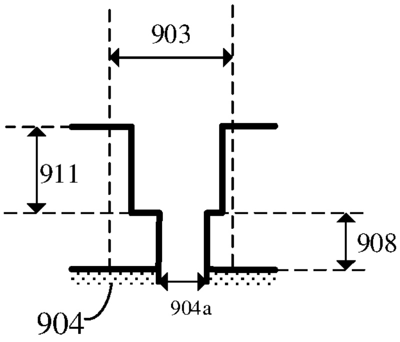

FIGS. 9A and 9B are sectional views of yet another exemplary semiconductor device made using the method shown in FIGS. 7A to 7G. FIG. 9B is a partially enlarged view of a step at an edge of the semiconductor element shown in FIG. 9A.

The semiconductor elements shown in FIG. 9A are similar as one of the semiconductor elements shown in FIG. 7D. As shown in FIG. 9A, a semiconductor substrate can be singulated at the saw street 903 between two device regions 902. Furthermore, as illustrated in FIG. 9B, a backside opening 911 formed by the singulation has a width greater than a width of a frontside opening 908 formed by another singulation process at an active window 904*a*, and the frontside opening 909 is within the backside opening 911 in a horizontal direction. Edges of the frontside opening 908 and the backside opening 911 are not aligned with each other, such that two steps can be formed at the edges of the two singulated semiconductor elements.

FIGS. 10A to 10F are sectional views of various steps of a method for making a semiconductor device 1000 according to yet another embodiment of the present application. The embodiment shown in FIGS. 10A to 10F illustrates that an interconnect window 1006*a* can be formed through an interconnect layer 1006 for exposing an active layer 1004 of the semiconductor substrate 1001 at a saw street 1003 between two device regions 1002.

Figure 10A:
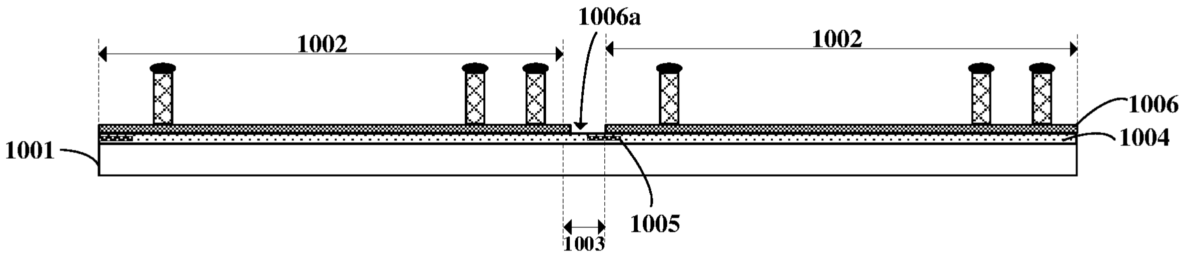
FIGS. 10A to 10F are sectional views of various steps of a method for making a semiconductor device according to yet another embodiment of the present application.

Referring to FIG. 10A, the interconnect window 1006*a* is formed at the interconnect layer 1006, and a waveguide 1005 in the active layer 1004 is partially positioned below the interconnect window 1006*a*.

Figure 10B:
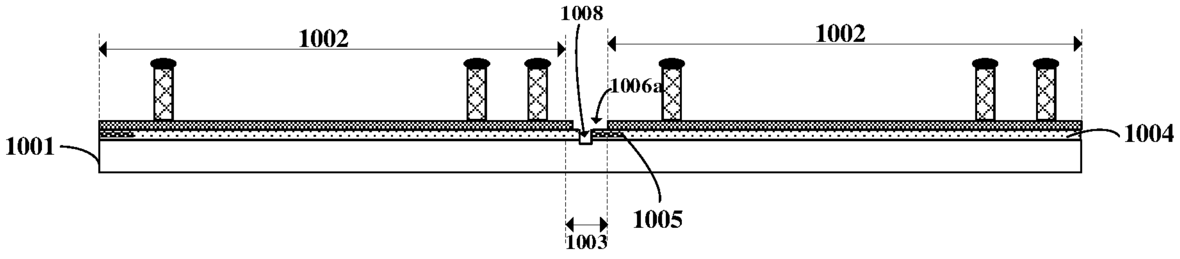

Turning to FIG. 10B, the semiconductor substrate 1001 including the active layer 1004 is etched to form a frontside opening 1008. An edge of the waveguide 1005 is adjacent to the frontside opening 1008 such that the waveguide 1005 can be exposed laterally from the active layer 1004 through the frontside opening 1008. The frontside opening 1008 can be etched by a blade, or using plasma or reactive ion etching (a patterned photoresist layer may be formed on the active layer and the interconnect layer in advance, as widely used in a photolithography process). Since the frontside opening 1008 is inside of the interconnect window 1006*a*, the waveguide 1005 can be formed in the remaining part of the active layer 1004 inside the interconnect window 1006*a*.

Figure 10C:
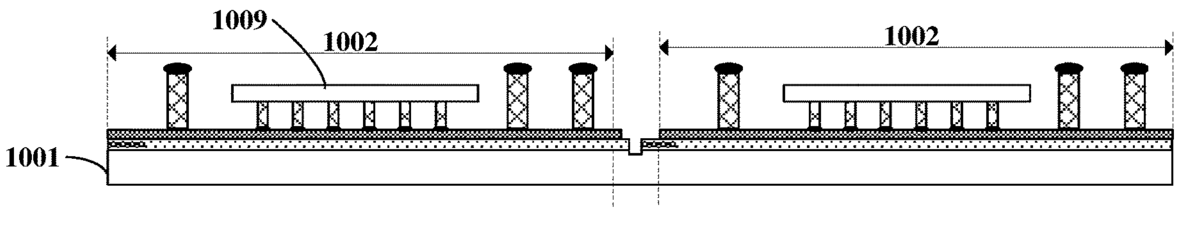
Figure 10D:
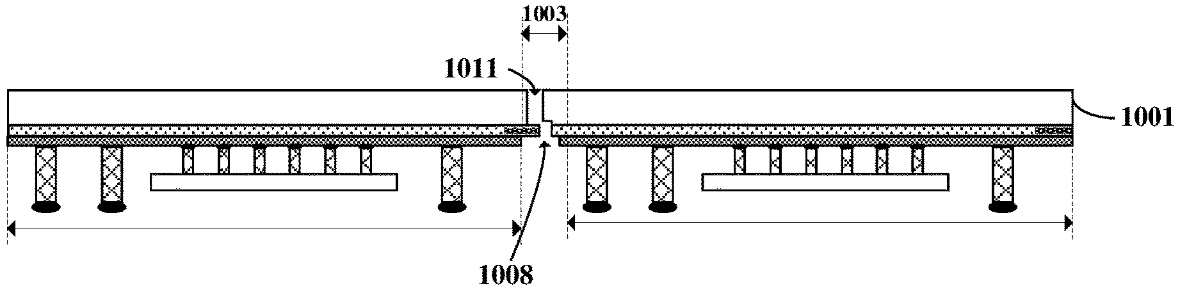

Next, various second semiconductor elements can be mounted onto the substrate 1001 at the respective device regions 1002 in FIG. 10C, and the semiconductor substrate 1001 is flipped with its back surface oriented upward in FIG. 10D. The back surface of the semiconductor substrate 1001 is etched to form a backside opening 1011 at the saw street 1003 using the method shown in FIGS. 7D and 7E. In this way, the waveguide is partially positioned at the step. Similarly, the backside opening 1011 is at least partially aligned with frontside opening 1008, and preferably with an offset in the horizontal direction.

Figure 10E:
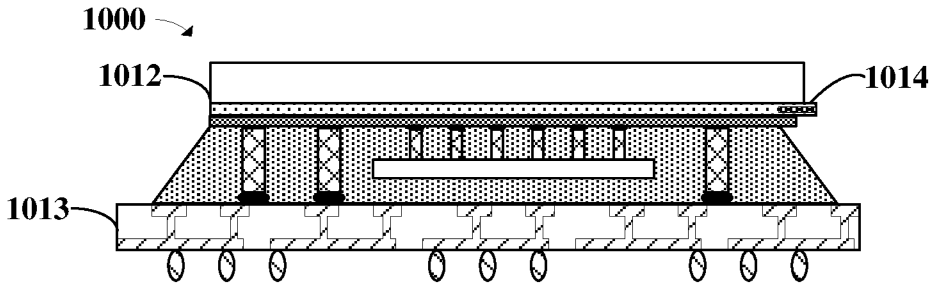
Figure 10F:
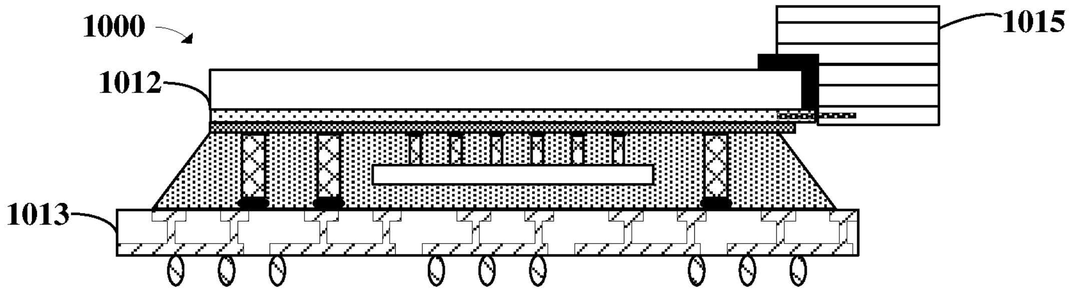

Since a sum depth of the backside opening and the frontside opening can be equal to or greater than a thickness of the semiconductor substrate, a semiconductor element 1012 with the step 1014 can be formed, as shown in FIG. 10E. Then, the semiconductor element 1012 can be mounted onto a substrate 1013 to form a semiconductor device 1000 in FIG. 10F. It can be seen that an auxiliary structure 1015 can be attached onto the step for better connection in FIG. 10F.

The discussion herein included numerous illustrative figures that showed various portions of a semiconductor device and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for singulating a semiconductor substrate into individual semiconductor devices, comprising:

providing a semiconductor substrate having a front surface and a back surface, wherein the semiconductor substrate comprises device regions that are separated from each other by respective predetermined saw streets, wherein the semiconductor substrate comprises an active layer that is exposed from the front surface and a bulk layer further below the active layer;

forming an interconnect layer on the front surface of the semiconductor substrate;

etching the front surface of the semiconductor substrate at the predetermined saw streets to form respective frontside openings each having a first depth, wherein the first depth is smaller than a thickness of the semiconductor substrate, wherein etching the front surface of the semiconductor substrate comprises:

patterning the active layer of the semiconductor substrate at the predetermined saw streets to form respective active windows that expose the bulk layer; and etching the front surface of the semiconductor substrate at the active windows using deep reactive ion etching process;

attaching a semiconductor element onto the front surface of the semiconductor substrate in each device region; and etching the back surface of the semiconductor substrate at the respective predetermined saw streets to form respective backside openings each having a second depth, wherein each frontside opening is at least partially aligned with the backside opening at the same saw street to singulate the device regions of the semiconductor substrate into individual semiconductor devices.

2. The method of claim 1, wherein after forming an interconnect layer, the method further comprises:

forming a first set of conductive pillars in each device region that are electrically connected to the interconnect layer in the device region, wherein the first set of conductive pillars have a height greater than a height of the semiconductor element.

3. The method of claim 1, wherein before forming an interconnect layer, the method further comprises:

forming an active layer on the front surface of the semiconductor substrate; and etching the active layer at the respective predetermined saw streets to form respective active windows that expose the front surface of the semiconductor substrate, wherein a waveguide is formed within the active layer in each device region and adjacent to the corresponding active window to laterally expose the waveguide.

4. The method of claim 1, wherein each frontside opening has a width smaller than a width of the corresponding predetermined saw street.

5. The method of claim 4, wherein the width of the frontside openings is 20% to 90% of the width of the predetermined saw streets.

6. The method of claim 4, wherein each frontside opening has an offset relative to the corresponding predetermined saw street.

7. The method of claim 6, wherein each backside opening has a width that is substantially equal to a width of the corresponding predetermined saw street.

8. The method of claim 1, wherein each backside opening has a width that is substantially equal to a width of the corresponding predetermined saw street.

9. The method of claim 1, wherein each frontside opening has a first width smaller than a width of the corresponding predetermined saw street, each backside opening has a second width smaller than the width of the corresponding predetermined saw street, and wherein each frontside opening has an offset relative to the backside opening at the same saw street to form a step at an edge of the corresponding semiconductor device at the saw street.

10. The method of claim 9, wherein etching the front surface of the semiconductor substrate comprises:

etching the front surface of the semiconductor substrate using deep reactive ion etching process; and etching the back surface of the semiconductor substrate using deep reactive ion etching process.

11. A method for making a semiconductor device, comprising:

providing a semiconductor substrate having a front surface and a back surface, wherein the semiconductor substrate comprises device regions that are separated from each other by respective predetermined saw streets;

forming an interconnect layer on the front surface of the semiconductor substrate;

etching the front surface of the semiconductor substrate at the predetermined saw streets to form respective frontside openings each having a first depth and a first width, wherein the first depth is smaller than a thickness of the semiconductor substrate, and the first width is smaller than a width of the corresponding predetermined saw street;

attaching a semiconductor element onto the front surface of the semiconductor substrate in each device region;

etching the back surface of the semiconductor substrate at the respective predetermined saw streets to form respective backside openings each having a second depth and a second width, wherein each frontside opening is partially aligned with the backside opening with an offset at the same saw street to singulate the device regions of the semiconductor substrate into individual semiconductor devices and form a step at an edge of the corresponding semiconductor device at the saw street;

attaching the individual semiconductor device to an external substrate through a first set of the conductive pillars; and attaching onto the step of each semiconductor device an auxiliary structure.

12. The method of claim 11, wherein after forming an interconnect layer, the method further comprises:

forming a first set of conductive pillars in each device region that are electrically connected to the interconnect layer in the device region, wherein the first set of conductive pillars have a height greater than a height of the semiconductor element.

13. The method of claim 11, wherein before forming an interconnect layer, the method further comprises:

forming an active layer on the front surface of the semiconductor substrate; and etching the active layer at the respective predetermined saw streets to form respective active windows that expose the front surface of the semiconductor substrate, wherein a waveguide is formed within the active layer in each device region and adjacent to the corresponding active window to laterally expose the waveguide.

14. The method of claim 11, wherein the semiconductor substrate comprises an active layer that is exposed from the front surface and a bulk layer further below the active layer, and wherein etching the front surface of the semiconductor substrate comprises:

patterning the active layer of the semiconductor substrate at the predetermined saw streets to form respective active windows that expose the bulk layer; and etching the front surface of the semiconductor substrate at the active windows using deep reactive ion etching process.

* * * * *